(12) United States Patent
Shimizu et al.

(10) Patent No.: US 8,048,687 B2
(45) Date of Patent: Nov. 1, 2011

(54) PROCESSING METHOD FOR RECOVERING A DAMAGED LOW-K FILM OF A SUBSTRATE AND STORAGE MEDIUM

(75) Inventors: Wataru Shimizu, Yamanashi (JP); Kazuhiro Kubota, Yamanashi (JP); Daisuke Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 7 days.

(21) Appl. No.: 12/791,082

(22) Filed: Jun. 1, 2010

(65) Prior Publication Data
US 2010/0304505 A1 Dec. 2, 2010

Related U.S. Application Data

(60) Provisional application No. 61/257,892, filed on Nov. 4, 2009.

(30) Foreign Application Priority Data

Jun. 1, 2009 (JP) ................................. 2009-132150

(51) Int. Cl.
*H01L 21/00* (2006.01)
(52) U.S. Cl. ........................................... 438/4; 438/935
(58) Field of Classification Search ........ 438/FOR. 450, 438/4, 503, 507, 935
See application file for complete search history.

(56) References Cited

U.S. PATENT DOCUMENTS
6,025,252 A * 2/2000 Shindo et al. ................. 438/509

FOREIGN PATENT DOCUMENTS
JP 2002-083869 A 3/2002
JP 2006-049798 A 2/2006

* cited by examiner

*Primary Examiner* — Ha Tran T Nguyen
*Assistant Examiner* — Thanh Y Tran
(74) *Attorney, Agent, or Firm* — Pearne & Gordon LLP

(57) ABSTRACT

There is provided a processing method for performing a recovery process on a damaged layer formed on a surface of a low-k film of a target substrate by introducing a processing gas containing a methyl group into a processing chamber. The method includes: increasing an internal pressure of the processing chamber up to a first pressure lower than a processing pressure for the recovery process by introducing a dilution gas into the processing chamber maintained in a depressurized state; then stopping the introduction of the dilution gas, and increasing the internal pressure of the processing chamber up to a second pressure as the processing pressure for the recovery process by introducing the processing gas into a region where the target substrate exists within the processing chamber; and performing the recovery process on the target substrate while the processing pressure is maintained.

9 Claims, 8 Drawing Sheets

8,048,687 B2

PROCESSING METHOD FOR RECOVERING A DAMAGED LOW-K FILM OF A SUBSTRATE AND STORAGE MEDIUM

CROSS-REFERENCE TO RELATED APPLICATION

This application claims the benefit of Japanese Patent Application No. 2009-132150 filed on Jun. 1, 2009, and U.S. Provisional Application Ser. No. 61/257,892 filed on Nov. 4, 2009, the entire disclosures of which are incorporated herein by reference.

FIELD OF THE INVENTION

The present disclosure relates to a processing method for performing a process for recovering an etching damage or an asking damage inflicted on a low dielectric constant film used as an interlayer insulating film in a semiconductor device formed by, e.g., a damascene method; and, also, relates to a storage medium storing therein a program for implementing the processing method.

BACKGROUND OF THE INVENTION

Recently, in order to meet demands for high-speed and high-integration semiconductor devices having highly miniaturized wiring patterns, inter-wiring capacitance needs to be reduced while wiring conductivity and electromigration tolerance need to be improved. For the purpose, copper (Cu) having high electromigration tolerance and higher conductivity than that of conventionally used aluminum (Al) or tungsten (W) has been used as a wiring material. Widely used as a technique for forming a Cu wiring is a damascene process that involves previously forming wiring trenches or connection holes in an interlayer insulating film or the like and then burying Cu in the wiring trenches or the connection holes (see, for example, Patent Document 1).

Meanwhile, along with the miniaturization of the semiconductor devices, a parasitic capacitance of an interlayer insulating film becomes an important factor in improving wiring performance, and a low dielectric constant film (low-k film) made of a low dielectric constant material is used as an interlayer insulating film. As a material of the low-k film, a material having an alkyl group such as a methyl group as an end group is generally utilized.

However, in the above-mentioned conventional damascene process, the low-k film is damaged during an etching process or a resist film removing (asking) process. Such damage causes an increase of a dielectric constant of the low-k film, resulting in diminishment of an effect of using the low-k film as the interlayer insulating film.

As a technique for recovering such damage, Patent Document 2 discloses a recovery process using a silylizing agent is performed after the etching or the resist film removing process is carried out. In the recovery process, a methyl-group-containing gas such as the silylizing agent modifies a surface of a damaged layer of which the end group becomes a —OH group by a damage inflicted thereon, so that the end group becomes a methyl group or a group containing a methyl-group.

Since the processing gas such as the silylizing agent for use in performing such a recovery process is usually of a high price, it has been attempted to minimize a usage of the processing gas by diluting the processing gas with a dilution gas such as a $N_2$ gas.

Patent Document 1: Japanese Patent Laid-open Publication No. 2002-083869
Patent Document 2: Japanese Patent Laid-open Publication No. 2006-049798

However, if a main processing gas diluted with the dilution gas is introduced into a chamber, a sufficient recovery process may not be achieved due to a reduced concentration of the processing gas and a reduced reaction by the dilution of the processing gas. Moreover, such a recovery process is performed while a semiconductor wafer (hereinafter, simply referred to as a wafer) having a low-k film is heated by a heater installed in a mounting table after the wafer is mounted on the mounting table. Since the inside of the chamber is in a depressurized state, it takes time until the wafer reaches a preset processing temperature. Thus, if the processing gas diluted with the dilution gas is introduced into the chamber, the introduced processing gas would remain unnecessary until the wafer reaches the processing temperature.

BRIEF SUMMARY OF THE INVENTION

In view of the foregoing, the present disclosure provides a processing method capable of reducing a use amount of a processing gas while obtaining a sufficient amount of processing gas contributing to a damage recovery process for a low dielectric constant film. Further, the present disclosure also provides a storage medium storing therein a program for implementing the processing method.

In accordance with one aspect of the present disclosure, there is provided a processing method for performing a recovery process on a damaged layer formed on a surface of a low-k film of a target substrate by introducing a processing gas containing a methyl group into a processing chamber in which the target substrate is accommodated. The method includes increasing an internal pressure of the processing chamber up to a first pressure lower than a processing pressure for the recovery process by introducing a dilution gas into the processing chamber maintained in a preset depressurized state; stopping the introduction of the dilution gas after the internal pressure of the processing chamber reaches the first pressure and increasing the internal pressure of the processing chamber up to a second pressure as the processing pressure for the recovery process by introducing the processing gas into a region where the target substrate exists within the processing chamber; and performing the recovery process on the target substrate while the processing pressure is maintained.

In the above-mentioned processing method, the processing gas may be introduced into the processing chamber from directly above the target substrate accommodated in the processing chamber. Further, when the processing gas or the dilution gas is introduced, the internal pressure of the processing chamber may be controlled by a pressure control mechanism for controlling an exhaust amount within the processing chamber while the gas is introduced into the processing chamber. Furthermore, the internal pressure of the processing chamber may be maintained at the processing pressure by hermetically sealing the processing chamber during the recovery process.

Moreover, the target substrate may be horizontally placed within the processing chamber, and the processing gas may be introduced into the processing chamber from a processing gas discharge region provided above the target substrate at a position corresponding to a center of the target substrate and having a smaller diameter than a diameter of the target substrate. Here, the dilution gas may be introduced into the processing chamber from a dilution gas discharge region provided above the target substrate at a position corresponding to the outside of the target substrate within the processing chamber. In this case, when the dilution gas is introduced into the processing chamber, prior to introducing the dilution gas, the processing method may further include simultaneously introducing both the dilution gas and the processing gas into the processing chamber from the dilution gas discharge region and the processing gas discharge region and increasing the internal pressure of the processing chamber to a third pressure lower than the first pressure.

In accordance with another aspect of the present disclosure, there is provided a storage medium storing therein a computer-executable program for controlling a processing apparatus to carry out the above-mentioned processing method.

In accordance with the present disclosure, the above-mentioned method includes increasing the internal pressure of the processing chamber up to the first pressure lower than the processing pressure for the recovery process by introducing the dilution gas into the processing chamber maintained in the preset depressurized state; then stopping the introduction of the dilution gas and increasing the internal pressure of the processing chamber up to the second pressure as the processing pressure for the recovery process by introducing the processing gas into the region where the target substrate exists within the processing chamber; and performing the recovery process on the target substrate at the processing pressure. Since the processing gas is introduced into the target substrate presence region after the processing chamber is filled with the dilution gas of a preset pressure and the supply of the dilution gas is stopped, the processing gas may not diffuse to a periphery region of the processing chamber. Accordingly, a region in which a concentration of the processing gas is high may be formed in the vicinity of the target substrate. As compared to a case in which the processing gas is supplied in a uniform concentration across the entire processing chamber, an amount of the processing gas contributing to the recovery process of the target substrate can be increased. Thus, an introduction amount of the processing gas itself can be reduced while a sufficient amount of processing gas may be applied to the target substrate.

BRIEF DESCRIPTION OF THE DRAWINGS

The disclosure may best be understood by reference to the following description taken in conjunction with the following figures.

DETAILED DESCRIPTION OF THE INVENTION

Figure 1:
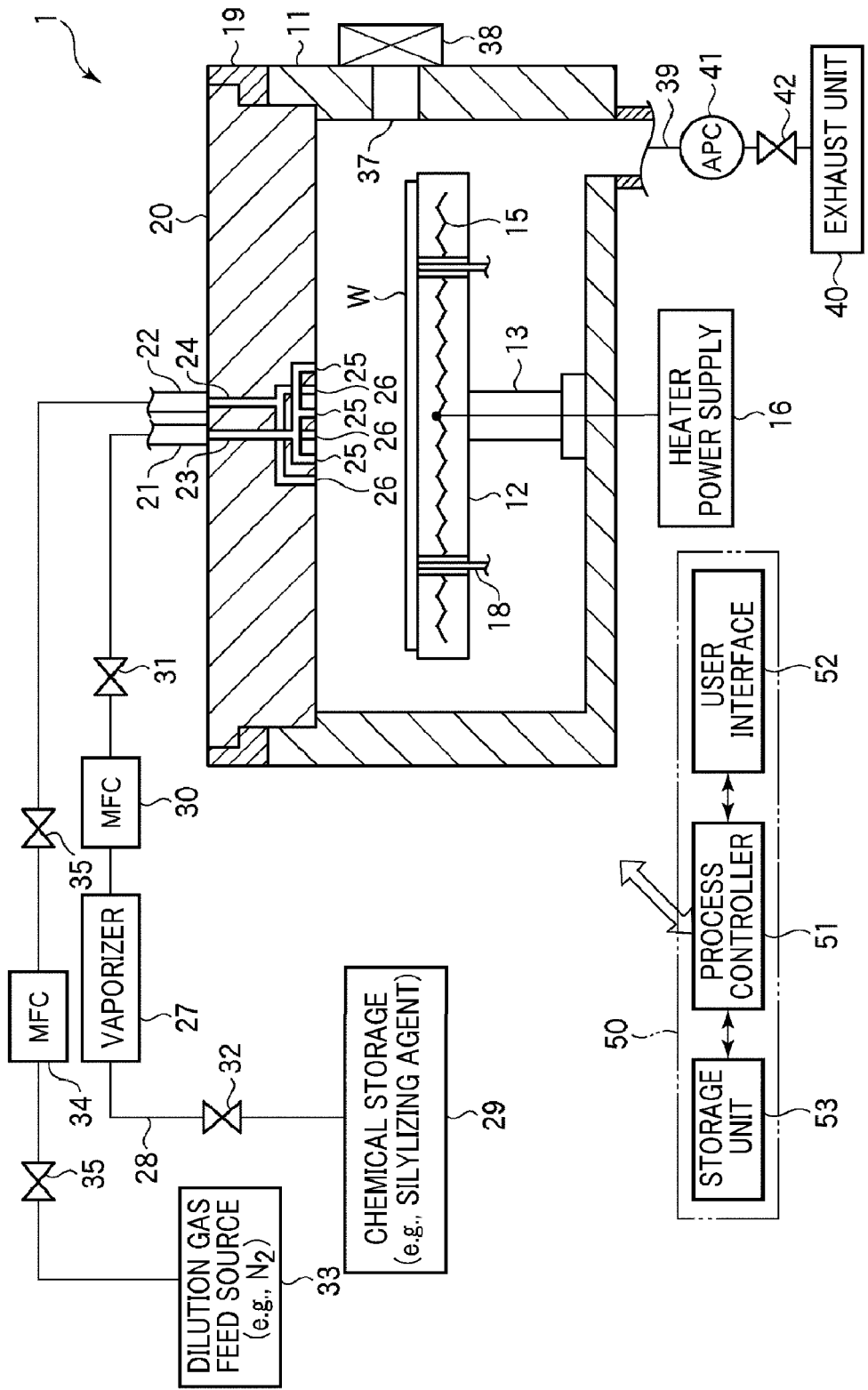
FIG. 1 is a cross sectional view illustrating an example processing apparatus capable of performing a processing method of the present disclosure.
Figure 2:
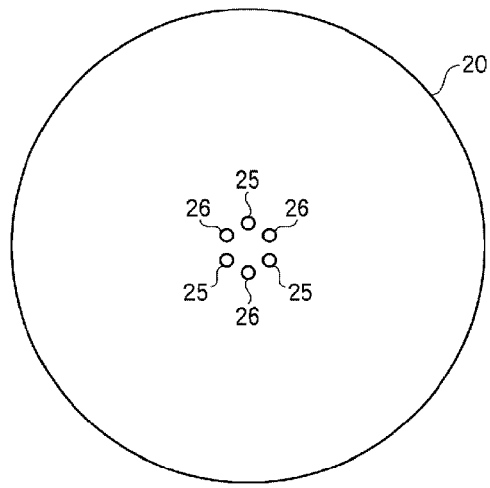
FIG. 2 is a bottom view illustrating a gas inlet head for use in the processing apparatus of FIG. 1.

Hereinafter, embodiments of the present disclosure will be described with reference to the accompanying drawings. FIG. 1 is a cross sectional view illustrating an example processing apparatus capable of performing a processing method in accordance with the present disclosure, and FIG. 2 is a bottom view illustrating a gas inlet head for use in the processing apparatus of FIG. 1.

The processing apparatus 1 includes a chamber 11 configured to accommodate therein a wafer W as a target substrate. A mounting table 12 for horizontally holding the wafer W is installed within the chamber 11. The mounting table 12 is supported by a cylindrical supporting member 13 extending upward from a central bottom portion of the chamber 11. Further, a resistance heater 15 is embedded in the mounting table 12. The heater 15 is configured to heat the mounting table 12 by a power fed from a heater power supply 16, and, thus, the wafer W on the mounting table 12 is also heated by the heater. Further, a thermocouple (not shown) is also embedded in the mounting table 12 so as to control the wafer W to a preset temperature. Three wafer supporting pins (only two of them are shown) 18 for supporting and elevating the wafer W are provided in the mounting table 12, and the pins 18 can be protruded from and retracted into a surface of the mounting table 12.

A top portion of the chamber 11 is opened, and a ring-shaped lid 19 is provided along an upper end portion of the chamber 11. A gas inlet head 20 configured to introduce a processing gas and a dilution gas is supported by the lid 19. The gas inlet head 20 is hermetically sealed against the chamber 11 by a sealing member (not shown). A processing gas feed pipe 21 and a dilution gas feed pipe 22 configured to feed the processing gas and the dilution gas, respectively, are connected to an upper central portion of the gas inlet head 20. A processing gas flow path 23 connected to the processing gas feed pipe 21 and a dilution gas flow path 24 connected to the dilution gas feed pipe 22 are provided within the gas inlet head 20. Further, three processing gas discharge holes 25 are branched from the processing gas flow path 23 and extended to a bottom surface of the gas inlet head 20, and three dilution gas discharge holes 26 are branched from the dilution gas flow path 24 and extended to the bottom surface of the gas inlet head 20. As illustrated in FIG. 2, the processing gas discharge holes 25 and the dilution gas discharge holes 26 are alternately arranged at a central portion of the bottom surface of the gas inlet head 20 so as to be located at positions corresponding to respective vertexes of a regular hexagon. Accordingly, a processing gas discharge region provided with the three processing gas discharge holes 25 and a dilution gas discharge region provided with the three dilution gas discharge holes 26 have a smaller diameter than a diameter of the wafer W and are provided directly above the wafer W. In this configuration, the processing gas and the dilution gas can be both introduced into a region of the wafer W.

A vaporizer 27 is connected to the other end of the processing gas feed pipe 21. A chemical pipe 28 extending from a chemical storage 29 configured to store therein a liquid chemical for supplying the processing gas is connected to the vaporizer 27. The liquid chemical is supplied from the chemical storage 29 into the vaporizer 27 via the chemical pipe 28 by force-feed gas or the like. Then, the processing gas vaporized from the liquid chemical by the vaporizer 27 is sent into the processing gas feed pipe 21. The processing gas feed pipe 21 is provided with a mass flow controller 30 and a valve 31 configured to control a flow rate of the processing gas. Further, a valve 32 is provided in the chemical pipe 28.

The processing gas recovers (restores) a low-k film's damaged portion, which is caused by etching or asking, by a methyl group (—$CH_3$). Thus, a gas containing a methyl group (—$CH_3$) may be used as the processing gas. For example, the processing gas having the methyl group may be a silylizing agent such as TMSDMA (N-Trimethylsilyldimethylamine), DMSDMA (Dimethylsilyldimethylamine), TMDS (1,1,3,3-Tetramethyldisilazane), TMSPyrole (1-Trimethylsilylpyrole), BSTFA (N,O-Bis(trimethylsilyl) trifluoroacetamide), or BDMADMS (Bis(dimethylamino) dimethylsilane). In case that damage is recovered by the silylizing agent, the damaged portion would be substituted with a $S_1$—$CH_3$. Besides the silylizing agent, the processing gas having the methyl group may be DPM (Dipivaloyl Methane), DMC (Dimethylcarbonate), acetylacetone, or the like.

A dilution gas feed source 33 that supplies the dilution gas is connected to the other end of the dilution gas feed pipe 22. The dilution gas feed pipe 22 is provided with a mass flow controller 34 for controlling a flow rate of the dilution gas; and valves 35 positioned upstream and downstream of the mass flow controller 34. The dilution gas may be a $N_2$ gas. Alternatively, a rare gas such as an Ar gas may be used as the dilution gas.

A wafer loading/unloading port 37 is provided in a sidewall of the chamber 11, and the wafer loading/unloading port 37 can be opened and closed by a gate valve 38. After the gate valve 38 is opened, the wafer W is transferred between the chamber 11 and a transfer chamber (not shown) adjacent to the chamber 11, and the transfer chamber is maintained under a vacuum and is provided with a transfer mechanism.

An exhaust pipe 39 is connected to a peripheral portion of a bottom of the chamber 11, and a gas exhaust unit 40 having a vacuum pump or the like is connected with the exhaust pipe 39. An automatic pressure control (APC) valve 41 and an opening/closing valve 42 are provided upstream of the gas exhaust unit 40 in the exhaust pipe 39. With this configuration, the inside of the chamber 11 is evacuated by the gas exhaust unit 40 while an internal pressure of the chamber 11 is detected by a pressure sensor (not shown) and an opening degree of the APC valve 41 is controlled, so that the inside of the chamber 11 can be controlled to a preset pressure. When the internal pressure of the chamber 11 reaches the preset value during the processing, the chamber 11 filled with the processing gas therein is hermetically sealed by the opening/closing valve 42.

The processing apparatus 1 includes a control unit 50. The control unit 50 controls each component of the processing apparatus 1 and includes a process controller 51 having a microprocessor (computer) that actually controls each component of the processing apparatus 1. Connected to the process controller 51 is a user interface 52 including a keyboard with which an operator inputs commands to manage the processing apparatus 1 or a display on which an operational status of the processing apparatus 1 is visually displayed. Further, the process controller 51 is also connected with a storage unit 53 storing therein control programs to be used in controlling each component of the processing apparatus 1; and programs to be used in implementing a preset process by the processing apparatus 1, i.e., processing recipes. The processing recipes may be stored in a storage medium of the storage unit 53. The storage medium may be a fixed device such as a hard disk, or may be a portable device such as a CDROM, a DVD, a flash memory, or the like. Alternatively, the processing recipes may be appropriately received from another apparatus via, for example, a dedicated line. If necessary, a processing recipe can be retrieved from the storage unit 53 in response to an instruction from the user interface 52 and then executed by the process controller 51, so that a predetermined process can be performed under the control of the process controller 51.

Hereinafter, in accordance with an embodiment of the present disclosure, there will be explained a processing method for performing a recovery process for a wafer W's low-k film having thereon a damaged layer by using the processing apparatus 1. Here, the recovery process using a processing gas containing a methyl group (—$CH_3$) is performed for the damaged layer which was formed on the surface of the low-k film during an etching or ashing process of a dual damascene method or the like for forming a wiring trench or a connection hole.

The low-k film may be, e.g., MSQ (methyl-hydrogen-SilsesQuioxane) (either porous or dense) formed by a SOD (Spin on Dielectric) device, or a SiOC-based film as one of inorganic insulating films formed by a CVD (the SiOC-based film is obtained by introducing a methyl group (—$CH_3$) to an Si—O bond of a conventional $SiO_2$ film, thus allowing a Si—$CH_3$ bond to coexist; Black Diamond (Applied Materials Corp.), Coral (Novellus Systems Inc.), Aurora (ASM International N.V.) and so forth are examples of the SiOC-based film; and both porous one and dense one are available). Besides these Si-containing films, a film containing C, O and H without Si can also be used. Further, a CF-based insulating film may also be used as the low-k film.

Figure 3:
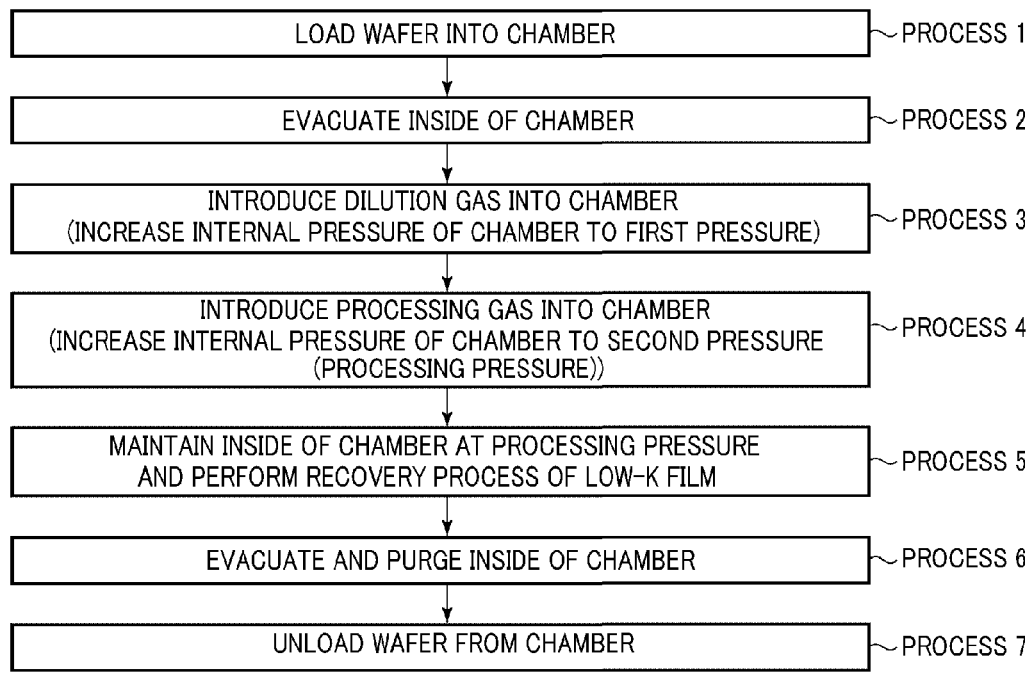
FIG. 3 is a flowchart illustrating a processing method performed by the processing apparatus of FIG. 1 in accordance with a first embodiment of the present disclosure.
Figure 4:
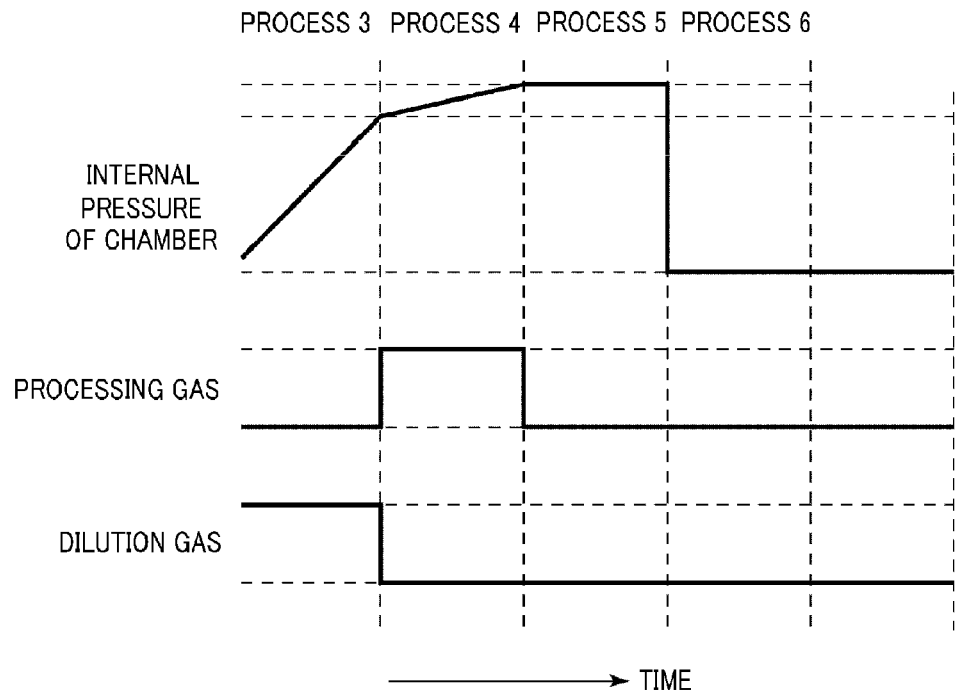
FIG. 4 is a timing chart for gas introduction and variation of an in-chamber pressure when the processing method of FIG. 3 is performed.

FIG. 3 is a flowchart showing the processing method in accordance with the present embodiment. FIG. 4 is a timing chart for gas introduction and variation of an internal pressure of the chamber when the processing method is performed.

First, after a gate valve 38 is opened, a wafer W provided with a low-K film having an etching damage or an ashing damage is loaded into the chamber 11 through the loading/unloading port 37 and is mounted on the mounting table 12 heated at a preset temperature (process 1). Then, the chamber 11 is evacuated so as to maintain the inside of the chamber 11 under a vacuum state of a preset pressure (process 2). Subsequently, a dilution gas is introduced into the chamber 11 from the dilution gas feed source 33 via the dilution gas feed pipe 22, the dilution gas flow path 24 and the dilution gas discharge holes 26 of the gas inlet head 20 (process 3). The dilution gas introduced into the chamber 11 is uniformly diffused within the entire region of the chamber 11, and an internal pressure of the chamber 11 increases, as shown in FIG. 4. The introduction of the dilution gas is continued until the internal pressure of the chamber 11 reaches a first pressure lower than a processing pressure. Desirably, a flow rate of the dilution gas may be about 100 to about 7000 mL/min (sccm). A $N_2$ gas may be appropriately used as the dilution gas, or a rare gas such as an Ar gas may be used. Desirably, the first pressure may be equivalent to about 40% to about 96% of the processing pressure for the recovery process. For example, when the processing pressure is about 667 Pa (5 Torr), the first pressure may be in the range of about 267 to about 640 Pa (about 2.0 to about 4.8 Torr). Such a control of the internal pressure of the chamber 11 may be performed by the APC valve 41 while the dilution gas is introduced into the chamber 11.

The supply of the dilution gas is stopped when the internal pressure of the chamber 11 reaches the first pressure, and a liquid chemical for generating a processing gas such as DMC or a silylizing agent (e.g., TMSDMA) is supplied into the vaporizer 27 from the chemical storage 29 via the chemical feed pipe 28 by a force-feed gas or the like (process 4). Further, in this process, the methyl-group-containing processing gas vaporized from the liquid chemical by the vaporizer 27 is introduced into the chamber 11 via the processing gas feed pipe 21, the processing gas flow path 23 and the processing gas discharge holes 25 of the gas inlet head 20. As a result, the internal pressure of the chamber 11 is further increased as indicated in FIG. 4. The introduction of the processing gas is continued until the internal pressure reaches a second pressure which is the processing pressure. Desirably, a flow rate of the processing gas may be in the range of about 50 to about 1000 mL/min (sccm). If the flow rate of the processing gas is too small, processing time would be lengthened, whereas if the flow rate of the processing is too great, an effect of saving a use amount of the processing gas would be reduced.

When the internal pressure of the chamber 11 reaches the processing pressure, the supply of the processing gas is stopped, and the valve 42 is closed to thereby hermetically seal the chamber 11 with the processing gas therein, and a low-k film recovery process is performed while the internal pressure of the chamber 11 is maintained at the processing pressure (process 5). Desirably, in this recovery process, a temperature of the wafer W may be in the range of about 150° C. to about 300° C. Further, desirably, the internal pressure of the chamber may be in the range of about 667 Pa to about 4000 Pa (about 5 Torr to about 30 Torr), and the recovery processing time may be in the range of about 10 sec to about 420 sec.

In the recovery process, the methyl-group-containing processing gas is applied to the low-k film on a surface of which a damaged layer is formed due to a damage inflicted by an etching or asking process. As a result, a OH group of the damaged layer is substituted with a methyl group or a methyl-group-containing group, and, thus, a dielectric constant (k value) once raised due to the damage is reduced again.

After the recovery process is completed as stated above, the inside of the chamber 11 is purged by introducing the dilution gas as a purge gas from the dilution gas feed source 33 into the chamber 11 while the inside of the chamber 11 is evacuated by the gas exhaust unit 40 (process 6). Thereafter, the gate valve 38 is opened, and the wafer W on which the recovery process has been performed is unloaded through the loading/unloading port 37 (process 7).

Figure 5:
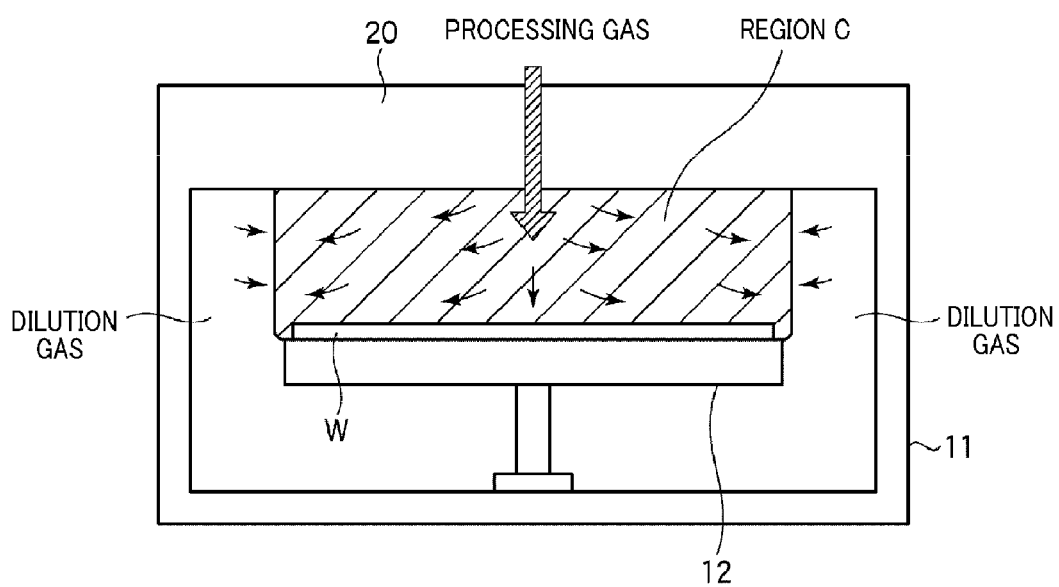
FIG. 5 is a schematic diagram illustrating a state when a processing gas is introduced into a chamber after the chamber is filled with a dilution gas.

In the processing method as described above, after the inside of the chamber 11 is filled with the dilution gas and the internal pressure of the chamber reaches the pressure lower than the processing pressure, the processing gas is introduced into a wafer region where the wafer W exists within the chamber 11 from a position corresponding to the wafer W (i.e., from directly above the wafer W) until the internal pressure of the chamber reaches the processing pressure. Here, molecular weight of the processing gas such as the TMSDMA is greatly different from molecular weight of the dilution gas such as the $N_2$ gas each other. Since gases having different molecular weights tend to be not easily mixed in a vacuum state, the processing gas introduced later may not diffuse to a periphery region of the chamber 11 already filled with the dilution gas. Thus, a region C in which a concentration of the processing gas is high is formed in the vicinity of the wafer W, as illustrated in FIG. 5. As the region having high concentration of the processing gas is locally formed in the vicinity of the wafer W, an amount of the processing gas contributing to the recovery process of the wafer W may be increased, as compared to a case where the processing gas has a uniform concentration across the entire chamber 11. Thus, a sufficient amount of the processing gas can be applied to the wafer W while an introduction amount of the processing gas itself is reduced. Although the processing gas diffuses to the periphery portion within the chamber 11 as time passes, the concentration of the processing gas in the vicinity of the wafer W can be maintained high for a certain period of time, thus allowing a recovery process reaction to progress sufficiently. In order to facilitate the recovery process by suppressing the diffusion of the processing gas, it may be desirable that the difference between molecular weight of the processing gas and molecular weight of the dilution gas is greater.

Now, an experiment result of a recovery process, which was actually performed using the apparatus as described above, will be explained. Here, TMSDMA as a silylizing agent containing a methyl group was used as a processing gas, and a $N_2$ gas was used as a dilution gas. A photoresist film containing a OH group was used as a sample that simulates a damaged low-k film, and the degree of recovery was evaluated based on a thickness difference Δt of the photoresist film between before and after performing the recovery process. It may be attempted to inspect the recovery process by actually using a wafer having a low-k film with a damage inflicted by an etching process or an asking process. In such a case, however, it is difficult to prepare a sample, and the accuracy of the inspection would be low. Given that the technical essence of the recovery process lies in substituting a methyl group or a methyl-group-containing group for a OH group, the recovery process can be evaluated with high accuracy and simplicity by performing the recovery process on the photoresist film containing the OH group.

Reference recipes were as follows:
processing pressure (overall pressure within the chamber): 667 Pa (5 Torr);
TMSDMA partial pressure: 100 Pa (0.75 Torr);
TMSDMA flow rate: 500 mL/min (sccm);
$N_2$ flow rate: 2833 mL/min (sccm);
temperature: 250° C.; and
time: 10 sec.

Figure 6:
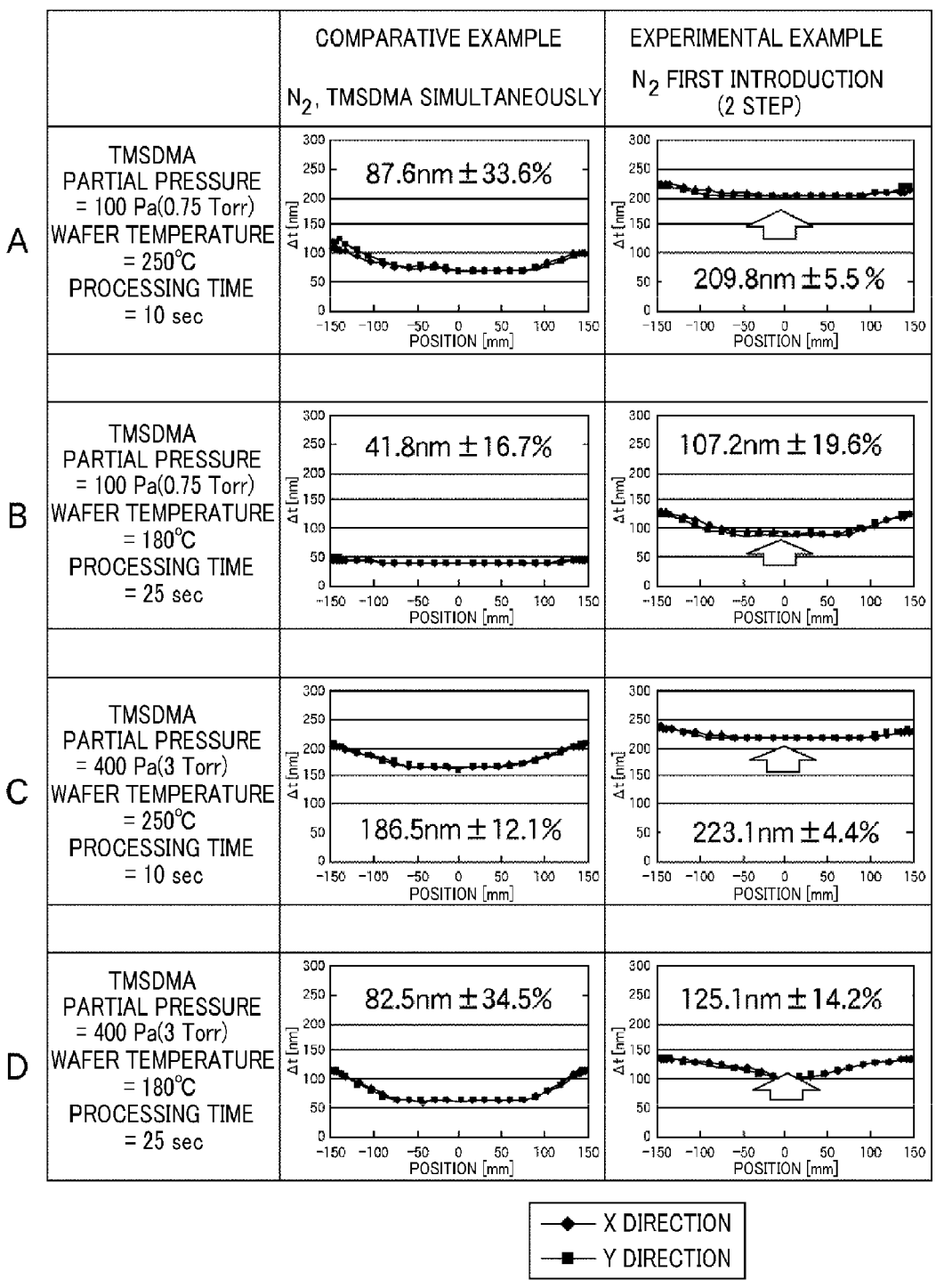
FIG. 6 are graphs, each showing a difference in film thicknesses Δt on wafer surfaces before and after recovery processes are performed by introducing a gas according to a conventional sequence (comparative example) and a present inventive sequence (experimental example), respectively.

First, under the above-specified reference condition (condition A), a recovery process was performed in two different cases: in one case (comparative example), the dilution gas and the processing gas were simultaneously introduced, as in a conventional case; and in the other case (experimental example), the processing gas was introduced after the $N_2$ gas was first introduced. After the recovery process was performed in each example, a film thickness difference Δt on a wafer surface before and after the recovery process was calculated. The result is provided in FIG. 6. As can be seen from FIG. 6, Δt was about 87.6 nm±33.6% under the condition A in the comparative example, whereas Δt was about 209.8 nm±5.5% under the same condition in the experimental example. Thus, it is found out that the degree of recovery in the experimental example is twice or more the degree of recovery in the comparative example. Then, from the reference condition A, the wafer temperature was reduced to about 180° C. from about 250° C. and the processing time was increased to about 25 sec (condition B). Under the condition B, a film thickness difference Δt before and after a recovery process was calculated for each of the experimental example and the comparative example. The result is also provided in FIG. 6. As can be seen from FIG. 6, Δt was about 41.8 nm±16.7% under the condition B in the comparative example, whereas Δt was about 107.2 nm±19.6% under the same condition in the experimental example. Thus, although the overall degree of recovery is relatively low as compared to the case of the reference condition A, it can be found out that the degree of recovery in the experimental example is twice or more the degree of recovery in the comparative example. Further, under a condition C in which the TMSDMA partial pressure of the reference condition A was raised to about 400 Pa (3 Torr) and under a condition D in which the TMSDMA partial pressure of the condition B was raised to about 400 Pa (3 Torr), a film thickness difference Δt between before and after performing the recovery process was measured for each of the experimental example and the comparative example. The result is also provided in FIG. 6. As can be seen from FIG. 6, Δt was about 186.5 nm±12.1% under the condition C in the comparative example, whereas Δt was about 223.1 nm±4.4% under the same condition in the experimental example. Further, under the condition D, Δt was about 82.5 nm±34.5% in the comparative example, whereas Δt was about 125.1 nm±14.2% in the experimental example. In each of these cases, it can be found out that the degree of recovery in the experimental example is higher than the degree of recovery in the comparative example. Especially, the condition A is deemed to be best among the conditions A to D if the degrees of recovery under the respective conditions are compared.

Further, a recovery process was performed according to a sequence of the experimental example while a flow rate of the TMSDMA of the reference condition A was varied from 100 mL/min (sccm) to about 300 mL/min (sccm) and to about 500 mL/min (sccm), respectively. To elaborate, when the flow rate of the TMSDMA was about 100 mL/min (sccm), a target pressure of about 567 Pa (4.25 Torr) was achieved just in about 8.0 sec in an initial $N_2$ gas introduction step, and a processing pressure of about 667 Pa (5 Torr) was achieved just in about 12.0 sec in a subsequent TMSDMA introduction step. Then, the chamber was hermetically sealed with the TMSDMA therein, and the recovery process was performed for about 10 sec. Further, when the flow rate of the TMSDMA was about 300 mL/min (sccm), the target pressure of about 567 Pa (4.25 Torr) was achieved just in about 8.0 sec in an initial $N_2$ gas introduction step, and the processing pressure of about 667 Pa (5 Torr) was achieved just in about 7.5 sec in a subsequent TMSDMA introduction step. Then, the chamber was hermetically sealed with the TMSDMA therein, and the recovery process was performed for about 10 sec. Furthermore, when the flow rate of the TMSDMA was about 500 mL/min (sccm), the target pressure of about 567 Pa (4.25 Torr) was achieved just in about 7.8 sec in an initial $N_2$ gas introduction step, and the processing pressure of about 667 Pa (5 Torr) was achieved just in about 7.0 sec in a subsequent TMSDMA introduction step. Then, the chamber was hermetically sealed with the TMSDMA therein, and the recovery process was performed for about 10 sec.

Figure 7:
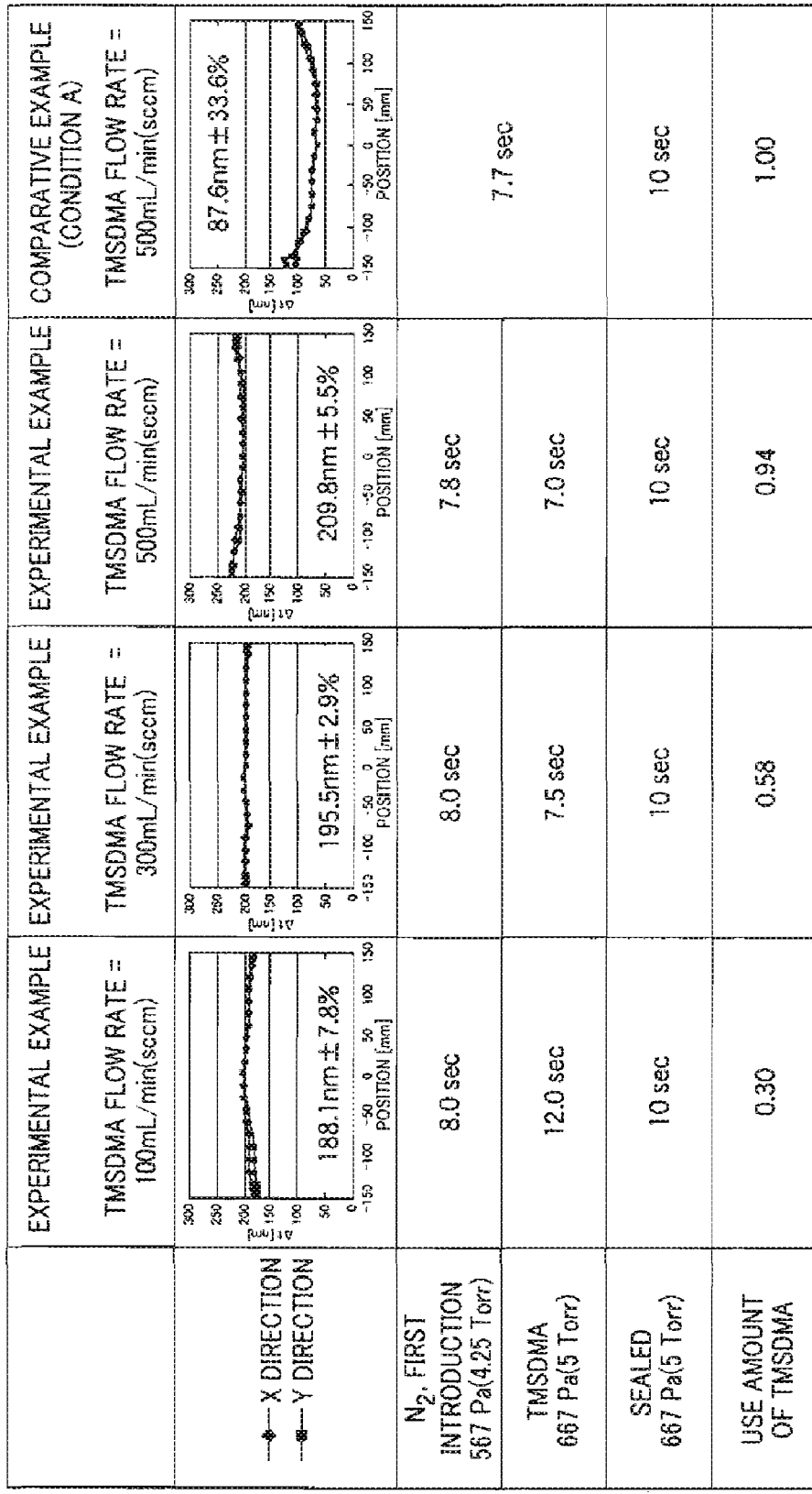
FIG. 7 are graphs, each showing a difference in film thickness Δt on wafer surfaces before and after recovery processes are performed by introducing a gas according to the sequence of the experimental example while a flow rate of TMSDMA as a processing gas is varied from about 100 to about 300 and to about 500 mL/min (sccm), as compared to the comparative example.

Those conditions and results of the recovery processes are provided in FIG. 7. For comparison, FIG. 7 also shows a result of a comparative example in which a $N_2$ gas and a TMSDMA are simultaneously introduced under the above-specified condition A. As depicted in FIG. 7, Δt was found to have a favorable value twice or more that of the comparative example regardless of the flow rate of the TMSDMA. Further, a use amount of the TMSDMA was calculated by integrating a log of the process. If the use amount of the TMSDMA in the comparative example of simultaneously introducing the $N_2$ gas and the TMSDMA under the condition A is about 1.00, the use amount of the TMSDMA is about 0.30, about 0.58 and about 0.94 when the flow rate of the TMSDMA is about 100 mL/min (sccm), about 300 mL/min (sccm) and about 500 mL/min (sccm), respectively. In each of these cases, the use amount of the TMSDMA is smaller than the use amount of the TMSDMA in the comparative example. Especially, the use amount of the TMSDMA is smallest when the flow rate is about 100 mL/min (sccm). In such case, however, it takes time to achieve a pressure rise by the introduction of the TMSDMA, and, thus, this flow rate is not desirable in consideration of a throughput. In contrast, when the flow rate of the TMSDMA is about 300 mL/min (sccm), the following good characteristics are shown: time taken for the pressure rise by the introduction of the TMSDMA is short; the valve of Δt is twice or more that of the comparative example; and the use amount of the TMSDMA is about 58% of that of the comparative example.

Figure 8:
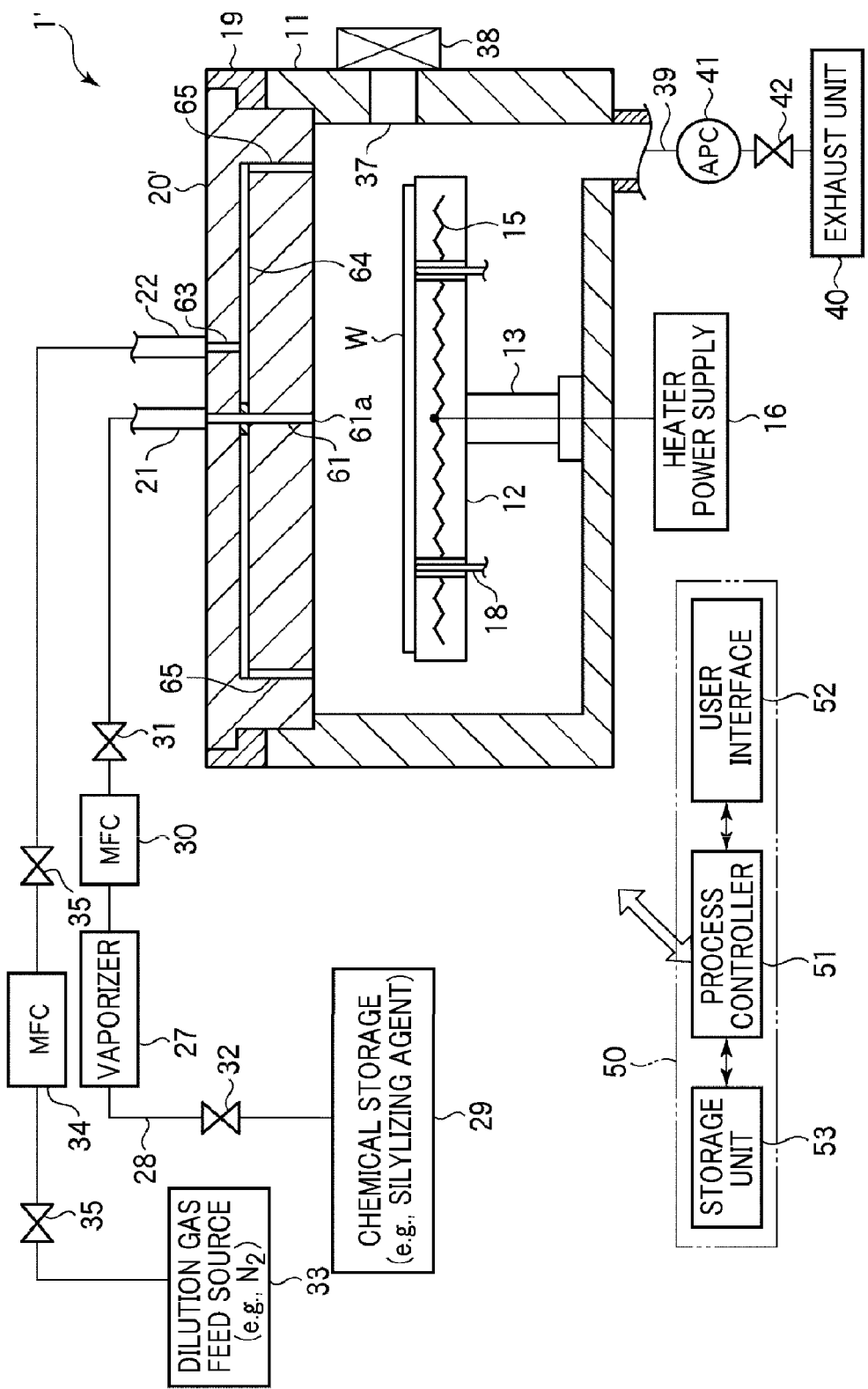
FIG. 8 is a cross sectional view illustrating another example processing apparatus capable of performing a processing method of the present disclosure.
Figure 9:
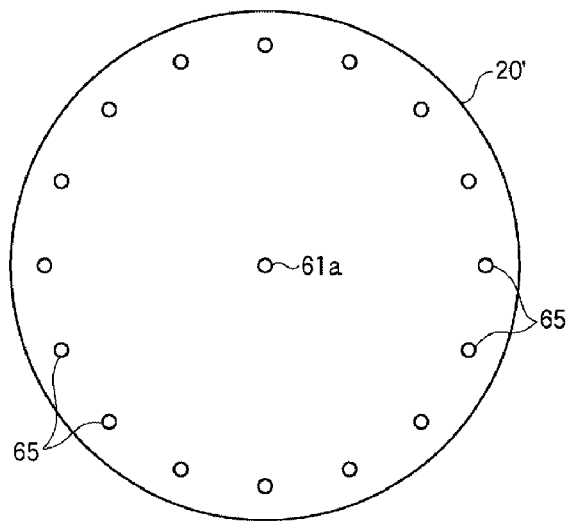
FIG. 9 is a bottom view illustrating a gas inlet head for use in the processing apparatus of FIG. 8.

Now, another apparatus capable of performing the method of the present disclosure will be explained. FIG. 8 is a cross sectional view illustrating another example processing apparatus capable of the performing the method of the present disclosure, and FIG. 9 is a bottom view illustrating a gas inlet head used in the processing apparatus of FIG. 8. This apparatus has the same configuration as that of the apparatus shown in FIG. 1 excepting for a configuration of the gas inlet head. Thus, same parts as those of FIG. 1 will be assigned same reference numeral, and redundant description thereof will be omitted.

The processing apparatus of FIG. 8 has a gas inlet head 20' instead of the gas inlet head 20 of the processing apparatus in FIG. 1. Like the gas inlet head 20, the gas inlet head 20' is supported by a lid 19 and hermetically sealed against a chamber 11 by a sealing member (not shown). A processing gas feed pipe 21 and a dilution gas feed pipe 22 configured to feed a processing gas and a dilution gas, respectively, are connected to an upper portion of the gas inlet head 20'. A processing gas flow path 61 connected to the processing gas feed pipe 21 and a dilution gas flow path 63 connected to the dilution gas feed pipe 22 are provided within the gas inlet head 20'. The processing gas feed pipe 21 is connected to a center of a top surface of the gas inlet head 20', and the processing gas flow path 61 is extended downward through a center of the gas inlet head 20' and is opened in a center of a bottom surface of the gas inlet head 20', thereby serving as a processing gas discharge hole 61a. Accordingly, a processing gas discharge region by the processing gas discharge hole 61a has a smaller diameter than a diameter of a wafer W and is provided directly above the wafer W, so that the processing gas is introduced into a region where the wafer W exists. Meanwhile, the dilution gas feed pipe 22 is connected to a position deviated from the center of the top surface of the gas inlet head 20', and the dilution gas flow path 63 is extended downward from that position and is connected to a circular plate-shaped gas diffusion space 64 which is horizontally extended within the gas inlet head 20' to the vicinity of a periphery thereof. As illustrated in FIG. 9, a plurality of dilution gas discharge holes 65 is arranged on a circumference at positions corresponding to the outside of the wafer W mounted on a mounting table 12. With this configuration, the dilution gas can be discharged through the dilution gas discharge holes 65 into a region where the wafer W is not located.

In this apparatus, basically in the same sequence as that of the flowchart of FIG. 3, the wafer W is loaded into the chamber 11 and mounted on the mounting table 12. Then, after the inside of the chamber 11 is evacuated and turned into a vacuum state of a preset pressure, the dilution gas is first flown so that an internal pressure of the chamber 11 is controlled at a preset pressure lower than a processing pressure. Thereafter, the processing gas is flown so that the internal pressure of the chamber 11 is raised to the processing pressure. Then, a recovery process for a low-k film is performed while the internal pressure of the chamber 11 is maintained at the processing pressure. Accordingly, as in the apparatus of FIG. 1, the processing gas can be introduced into a region corresponding to the wafer W, and, thus, a region in which a concentration of the processing gas is locally high is formed in the vicinity of the wafer W. Further, as compared to a case where the processing gas has a uniform concentration across the entire chamber 11, an amount of the processing gas contributed to the recovery process of the wafer W increases. Therefore, an introduction amount of the processing gas itself can be saved while a sufficient amount of processing gas may be applied to the wafer W.

Figure 10:
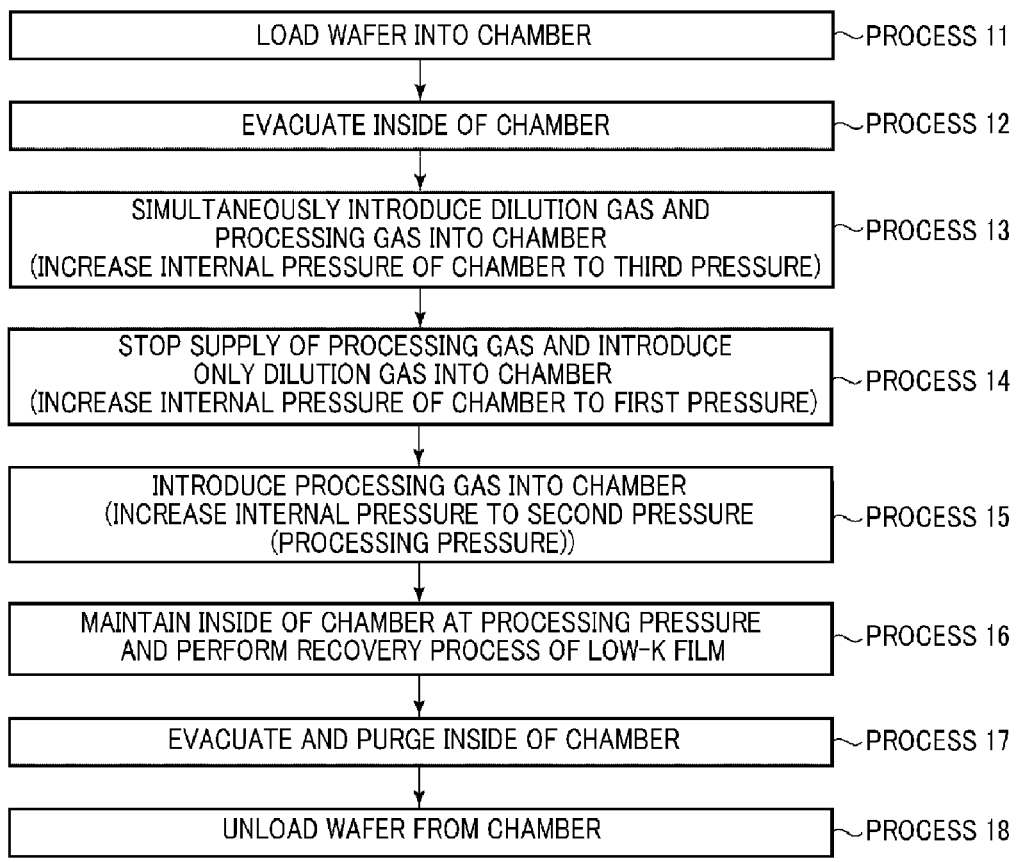
FIG. 10 is a flowchart illustrating a processing method performed by the processing apparatus of FIG. 8 in accordance with another embodiment of the present disclosure.
Figure 11:
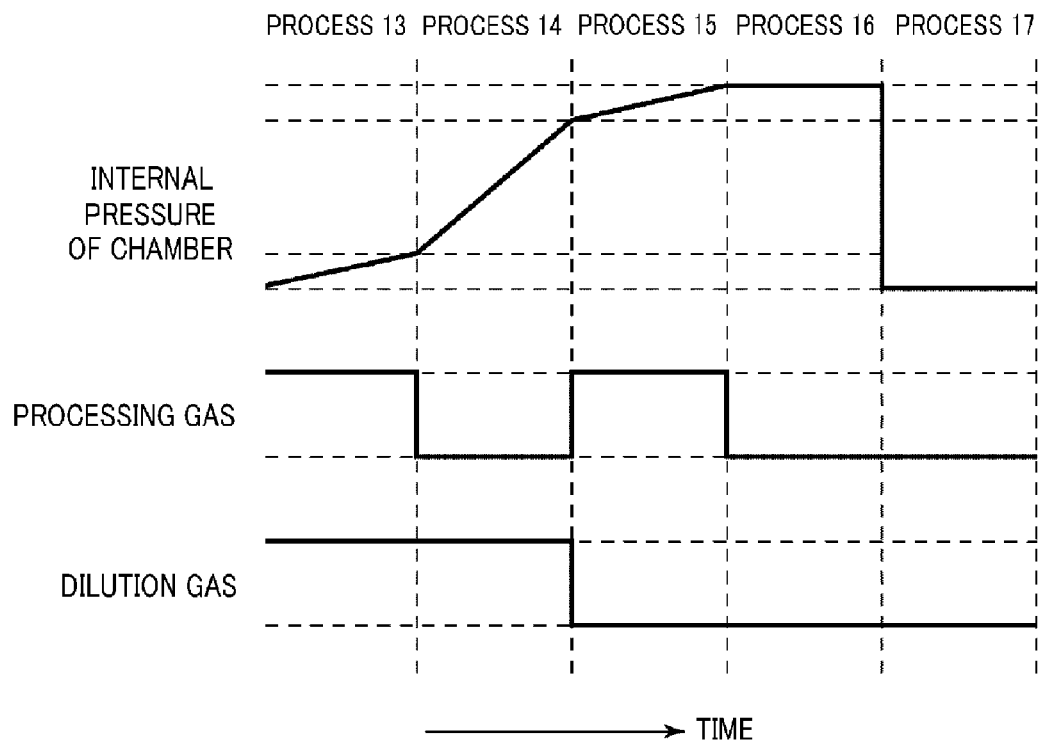
FIG. 11 is a timing chart for gas introduction and variation of an in-chamber pressure when the processing method of FIG. 10 is performed.
Figure 12:
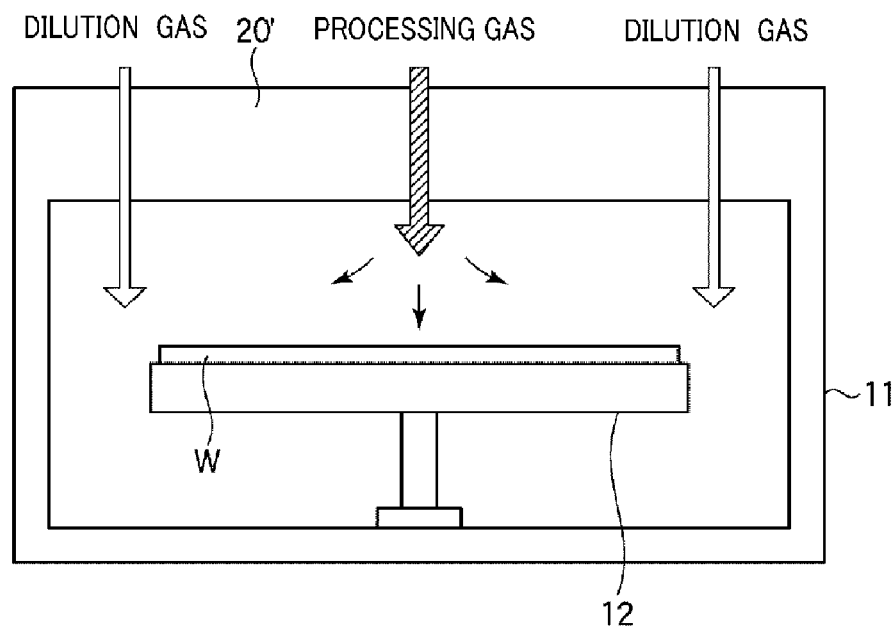
FIG. 12 is a schematic diagram illustrating an in-chamber state when process 13 of FIG. 10 is performed.

Among various low-k films, a porous low-k film can be considered. If the dilution gas is first flown into a chamber in which the porous low-k film is accommodated, the dilution gas may enter pores in the low-k film. Accordingly, even if the processing gas is subsequently flown, the processing gas may not enter the pores easily, resulting in insufficient progression of a recovery process. When the apparatus of FIG. 8 is used, the following method may be used to avoid this problem. FIG. 10 is a flowchart for describing the method, and FIG. 11 is a timing chart for gas introduction and variation of an in-chamber pressure. First, as in processes 1 and 2 of FIG. 3, after a gate valve 38 is opened, a wafer W having a low-k film damaged by etching or asking is loaded into the chamber 11 through a loading/unloading port 37, and the wafer W is mounted on the mounting table 12 heated to a preset temperature (process 11). Then, the inside of the chamber 11 is evacuated and turned into a vacuum state of a preset pressure (process 12). Subsequently, unlike the method disclosed in the flowchart of FIG. 3, the dilution gas and the processing gas are simultaneously introduced into the chamber 11 so that the internal pressure of the chamber 11 increases to a third pressure lower than the first pressure (process 13). Through process 13, the pores of the low-k film can be filled with the processing gas. That is, since the dilution gas is fed into the outside region of the wafer W and the processing gas is fed into the region corresponding to the wafer W in the apparatus of FIG. 8, almost only the processing gas can be supplied to the wafer W even when the dilution gas and the processing gas are both flown first, as illustrated in FIG. 12. Thus, entrance of the dilution gas into the pores of the low-k film and resultant impediment of the recovery process can be avoided. Here, since the processing gas only needs to fill the pores of the low-k film, the third pressure may be set low. Further, since the processing gas and the dilution gas are supplied together, an amount of the processing gas used in process 13 can be reduced. Such effects cannot be achieved by the apparatus of FIG. 1 in which the dilution gas is also introduced into the region corresponding to the wafer W.

As depicted in FIG. 10, the supply of the processing gas is stopped after process 13, and only the dilution gas is introduced into the chamber 11, as in process 3 of FIG. 3, so that the internal pressure of the chamber 11 increases to the first pressure (process 14). Then, the same processes 15 to 18 as processes 4 to 7 of FIG. 3 are implemented.

In the apparatus of FIG. 8, since the dilution gas is supplied into the outside region of the wafer W within the chamber 11 and the processing gas is supplied into the region corresponding to the wafer W, it takes time for the processing gas to diffuse to the outside of the wafer W even if the dilution gas and the processing gas are simultaneously supplied, not in a sequential manner as in FIG. 3 and FIG. 10. Accordingly, for a certain period, a region having a high concentration of processing gas can be formed in the region where the wafer W exists, and, thus, a sufficient recovery process can be performed on the low-k film by using a relatively small amount of the processing gas.

Moreover, it should be noted that the present disclosure is not limited to the above-stated embodiments but can be modified in various ways. For example, in the above-described embodiments, although various gases such as a silylizing agent are mentioned as the processing gas, any gas containing a methyl group may be used as the processing gas. Furthermore, the low-k film applicable to the present disclosure is not limited to the above-mentioned example but any one that becomes to have a OH group when damaged may be applicable. In addition, in the above embodiments, although the inside of the chamber is hermetically sealed during the recovery process, the recovery process may be performed while a pressure control is conducted by an automatic pressure control valve.

Moreover, in the above embodiments, three processing gas discharge holes are formed in the center of the gas inlet head in the apparatus of FIG. 1; only one processing gas discharge hole 61a is formed in the center of the gas inlet head in the apparatus of FIG. 8; and the processing gas discharge region having a smaller diameter than the diameter of the wafer W is formed and the processing gas is supplied from directly above the center of the wafer. However, the present disclosure is not limited to these configurations as long as the processing gas can be introduced into the wafer-presence-region within the chamber.

Further, in the above-described embodiments, although the semiconductor wafer is used as the target substrate, the target substrate is not limited to the above-mentioned example and any other substrates such as FPD (Flat Panel Display) may be used as the target substrate.

What is claimed is:
1. A processing method for performing a recovery process on a damaged layer formed on a surface of a low-k film of a target substrate by introducing a processing gas containing a methyl group into a processing chamber in which the target substrate is accommodated, the method comprising:
increasing an internal pressure of the processing chamber up to a first pressure lower than a processing pressure for the recovery process by introducing a dilution gas into the processing chamber maintained in a preset depressurized state;
stopping the introduction of the dilution gas after the internal pressure of the processing chamber reaches the first pressure, and increasing the internal pressure of the processing chamber up to a second pressure as the processing pressure for the recovery process by introducing the processing gas into a region where the target substrate exists within the processing chamber; and
performing the recovery process on the target substrate while the processing pressure is maintained.

2. The processing method of claim 1, wherein the processing gas is introduced into the processing chamber from directly above the target substrate accommodated in the processing chamber.

3. The processing method of claim 1, wherein, when the processing gas or the dilution gas is introduced, the internal pressure of the processing chamber is controlled by a pressure control mechanism for controlling an exhaust amount within the processing chamber while the gas is introduced into the processing chamber.

4. The processing method of claim 3, wherein the internal pressure of the processing chamber is maintained at the processing pressure by hermetically sealing the processing chamber during the recovery process.

5. The processing method of claim 1, wherein the internal pressure of the processing chamber is maintained at the processing pressure by hermetically sealing the processing chamber during the recovery process.

6. The processing method of claim 1, wherein the target substrate is horizontally placed within the processing chamber, and the processing gas is introduced into the processing chamber from a processing gas discharge region provided above the target substrate at a position corresponding to a center of the target substrate and having a smaller diameter than a diameter of the target substrate.

7. The processing method of claim 6, wherein the dilution gas is introduced into the processing chamber from a dilution gas discharge region provided above the target substrate at a position corresponding to the outside of the target substrate within the processing chamber.

8. The processing method of claim 7, further comprising:
prior to introducing the dilution gas, simultaneously introducing both the dilution gas and the processing gas into the processing chamber from the dilution gas discharge region and the processing gas discharge region, and increasing the internal pressure of the processing chamber to a third pressure lower than the first pressure.

9. A storage medium storing therein a computer-executable program, for controlling a processing apparatus to carry out a processing method, executed by a computer for performing a recovery process on a damaged layer formed on a surface of a low-k film of a target substrate, as recited in claim 1.

* * * * *

UNITED STATES PATENT AND TRADEMARK OFFICE
CERTIFICATE OF CORRECTION

| | | |
|---|---|---|
| PATENT NO. | : 8,048,687 B2 | |
| APPLICATION NO. | : 12/791082 | |
| DATED | : November 1, 2011 | |
| INVENTOR(S) | : Wataru Shimizu et al. | |

It is certified that error appears in the above-identified patent and that said Letters Patent is hereby corrected as shown below:

In the Specification, column 1, line 18, replace "asking" with -- ashing --

In the Specification, column 1, line 50, replace "asking" with -- ashing --

In the Specification, column 5, line 24, replace "asking" with -- ashing --

In the Specification, column 5, line 34, replace "$S_1$" with -- Si --

In the Specification, column 8, line 39, replace "asking" with -- ashing --

In the Specification, column 11, line 38, replace "asking" with -- ashing --

Signed and Sealed this
Tenth Day of January, 2012

David J. Kappos
*Director of the United States Patent and Trademark Office*